(12) United States Patent
Shin et al.

(10) Patent No.: US 11,735,267 B2
(45) Date of Patent: *Aug. 22, 2023

(54) MANAGING PRE-PROGRAMMING OF A MEMORY DEVICE FOR A REFLOW PROCESS

(71) Applicant: Micron Technology, Inc., Boise, ID (US)

(72) Inventors: Ji-Hye Shin, Palo Alto, CA (US); Foroozan S. Koushan, San Jose, CA (US); Tomoko Iwasaki, San Jose, CA (US); Jayasree Nayar, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 98 days.

This patent is subject to a terminal disclaimer.

(21) Appl. No.: 17/373,701

(22) Filed: Jul. 12, 2021

(65) Prior Publication Data

US 2021/0343346 A1    Nov. 4, 2021

Related U.S. Application Data

(63) Continuation of application No. 16/714,369, filed on Dec. 13, 2019, now Pat. No. 11,069,412.

(51) Int. Cl.
*G11C 16/00* (2006.01)
*G11C 16/12* (2006.01)
(Continued)

(52) U.S. Cl.
CPC ............ *G11C 16/12* (2013.01); *G06F 3/0604* (2013.01); *G06F 3/0659* (2013.01);
(Continued)

(58) Field of Classification Search
CPC .... G06F 3/0604; G06F 3/0659; G06F 3/0679; G11C 16/12; G11C 16/26; G11C 16/3459; G11C 13/0033; G11C 13/004; G11C 13/0064; G11C 13/0069; G11C 16/10; G11C 16/20; G11C 2013/0083; G11C 7/04; G11C 7/20; G11C 16/3404;
(Continued)

(56) References Cited

U.S. PATENT DOCUMENTS

| | | | |
|---|---|---|---|
| 9,928,914 B2 * | 3/2018 | Pan | G11C 7/04 |
| 11,069,412 B2 * | 7/2021 | Shin | G06F 3/0604 |
| 2017/0221568 A1 | 8/2017 | Pan et al. | |

* cited by examiner

*Primary Examiner* — Thong Q Le
(74) *Attorney, Agent, or Firm* — Lowenstein Sandler LLP

(57) ABSTRACT

A system includes a memory device and a processing device, operatively coupled with the memory device. The processing device is configured to perform operations that include determining a verify reference voltage associated with a logic state of a memory cell of the memory device, the verify reference voltage defining a target voltage level of a threshold voltage associated with the logic state; determining an amount of voltage compensation based on a thermal profile associated with a heat to be applied to the memory device, the thermal profile comprising a temperature associated with the heat and a period of time the heat is to be applied to the memory device; and updating the verify reference voltage using the amount of voltage compensation for an expected shift in the threshold voltage of the memory cell after the heat is applied to the memory device.

20 Claims, 6 Drawing Sheets

(51) Int. Cl.
 *G11C 16/34* (2006.01)
 *G06F 3/06* (2006.01)
 *G11C 16/26* (2006.01)

(52) U.S. Cl.
 CPC ........ *G06F 3/0679* (2013.01); *G11C 16/3459* (2013.01); *G11C 16/26* (2013.01)

(58) Field of Classification Search
 CPC ......... H01L 21/67098; H01L 21/67103; H01L 21/67109; H01L 21/67248; H01L 21/6833; H01L 21/6835; H05B 1/00; H05B 1/02; H05B 1/0202; H05B 1/0227; H05B 1/0233; H05B 2203/005; H05B 2203/013; H05B 2213/03; H05B 3/02; H05B 3/06; H05B 3/20
 See application file for complete search history.

MANAGING PRE-PROGRAMMING OF A MEMORY DEVICE FOR A REFLOW PROCESS

RELATED APPLICATIONS

This application is a continuation application of co-pending U.S. patent application Ser. No. 16/714,369, filed Dec. 13, 2019, which is herein incorporated in its entirety by this reference.

TECHNICAL FIELD

Embodiments of the disclosure relate generally to memory devices, and more specifically, relate to managing pre-programming of a memory device for a reflow process.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
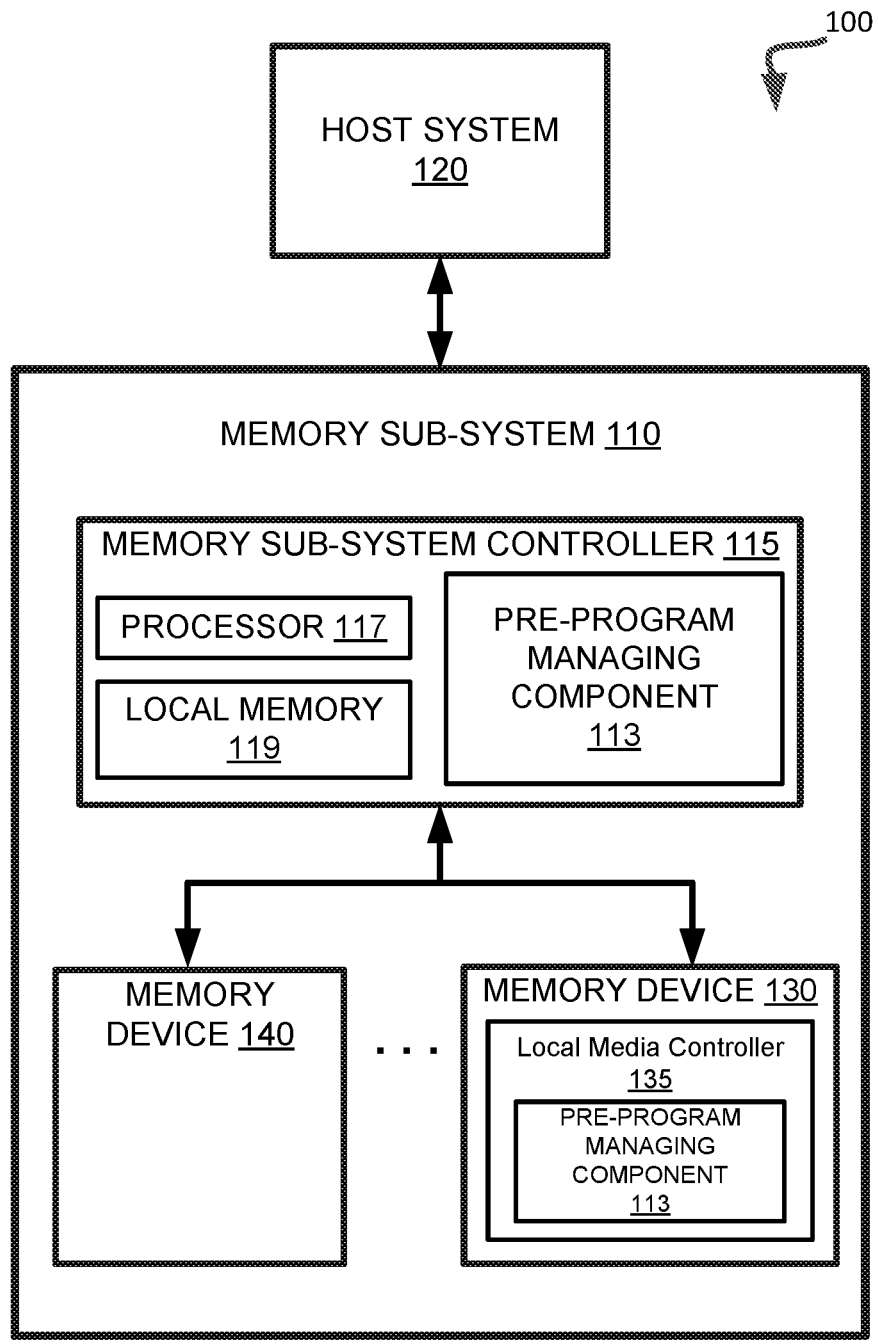
FIG. 1 illustrates an example computing system that includes a memory sub-system in accordance with some embodiments of the present disclosure.

Aspects of the present disclosure are directed to managing pre-programming of a memory device for a reflow process. A memory sub-system can be a storage device, a memory module, or a hybrid of a storage device and memory module. Examples of storage devices and memory modules are described below in conjunction with FIG. 1. In general, a host system can utilize a memory sub-system that includes one or more memory components, such as memory devices that store data. The host system can provide data to be stored at the memory sub-system and can request data to be retrieved from the memory sub-system.

The memory components can include non-volatile memory devices that store data from the host system. A non-volatile memory device is a package of one or more dice. The dice in the packages can be assigned to one or more channels for communicating with a memory sub-system controller. The non-volatile memory devices include cells (i.e., electronic circuits that store information), that are grouped into pages to store bits of data. The non-volatile memory devices can include three-dimensional cross-point ("3D cross-point") memory devices that are a cross-point array of non-volatile memory that can perform bit storage based on a change of bulk resistance, in conjunction with a stackable cross-gridded data access array. Another example of a non-volatile memory device is a negative-and (NAND) memory device. Other examples of non-volatile memory devices are described below in conjunction with FIG. 1.

Each of the memory devices can include one or more arrays of memory cells. A memory cell ("cell") is an electronic circuit that stores information. Depending on the cell type, a cell can store one or more bits of binary information, and has various logic states that correlate to the number of bits being stored. The logic states can be represented by binary values, such as "0" and "1", or combinations of such values. For example, a single level cell (SLC) can store one bit of information and has two logic states. As another example, a triple-level cell (TLC) can store 3 bit of information and has eight logic states (e.g., 000, 001, 010, 011, 100, 101, 110, and 111).

A memory device can be pre-programmed at a factory (e.g., via a tester) before the memory device is soldered onto a printed circuit board and dispatched to customers. A conventional pre-programming operation involves applying a series of incremental programming pulses (i.e., a single pulse at a time) to memory cells until a desired voltage level (i.e., a threshold voltage) for indicating a corresponding logic state is stored in the memory cells.

After the pre-programming phase, the memory device undergoes a reflow process. A reflow process involves soldering a memory device to a printed circuit board by applying a solder paste (e.g., lead-free solder paste) to both the memory device and the printed circuit board to permanently connect them together and baking the memory device and the printed circuit board at a high temperature. Subsequently, the data stored in the memory cells of the memory device is read in order to check for data integrity. Because the memory device is heated at a high temperature, the threshold voltage programed to a memory cell by the conventional pre-programming operation can be shifted causing data retention issue. Accordingly, a memory cell that was pre-programmed to store a certain logic state (e.g., 010), can instead be read as storing a different logic state (e.g., 011) after the reflow process. Such a threshold voltage shift can be the result from quick loss of charge stored in the memory cells during the conventional pre-programming operation or a redistribution of such charges due to the heat applied during the reflow process.

Aspects of the present disclosure address the above and other deficiencies by providing a memory sub-system that estimates an amount of shift in the threshold voltage of the memory cell that can result from heat applied during a reflow process and pre-compensates the threshold voltage for a logic state of a memory cell by such an amount during a pre-programming operation. The memory sub-system can determine the amount of threshold voltage shift based at least on a thermal profile used in the reflow process. Accordingly, after the reflow process, the threshold voltages of memory cells would shift to the intended voltage level thereby reducing data retention loss issue.

Other aspects of the present disclosure further provide a memory sub-system that applies sets of multiple programming pulses to memory cells during a pre-programming operation, in addition to the pre-compensation techniques described above. In these embodiments, multiple programming pulses of the same set can be applied consecutively at the same voltage level. As a result, quick charge losses causing the shift in threshold voltages can be suppressed. Moreover, in these embodiments, multiple programming pulses of the next set can also be applied consecutively at the same voltage level, but at a higher level than the previous set of multiple programming pulses.

Advantages of the present disclosure include, but are not limited to, ensuring integrity of data after a reflow process by reducing read error rates. As a result, the reliability of the memory sub-system can be improved. Data retention issues resulting from subjecting memory to a high temperature during reflow process can also be minimized.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and a non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access the memory components, such as memory devices 130, when the memory sub-system 110 is coupled with the host system 120 by the PCIe interface. The physical host interface can provide an interface for passing control, address, data, and other signals between the memory sub-system 110 and the host system 120.

The memory devices can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point type and NAND type memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric random access memory (FeRAM), magneto random access memory (MRAM), negative-or (NOR) flash memory, electrically erasable programmable read-only memory (EEPROM), and a cross-point array of non-volatile memory cells.

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., processing device) configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA, namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

In some embodiments, the memory device (e.g., memory device 130) includes a pre-program managing component 113 that manages a pre-programming operation performed before a reflow process. In some embodiments, the pre-program managing component 113 is a part of the local media controller (e.g., local media controller 135) of the memory device. In some embodiments, the memory sub-system 110 includes a pre-program managing component 113 that manages a pre-programming operation performed before a reflow process. In some embodiments, the memory sub-system controller 115 includes at least a portion of the pre-program managing component 113. For example, the memory sub-system controller 115 can include a processor 117 (processing device) configured to execute instructions stored in local memory 119 for performing the operations described herein. In some other embodiments, the pre-program managing component 113 can be a part of the host system 110, an application, or an operating system.

The pre-program managing component 113 can determine a logic state to be stored at a memory cell of a memory device 130, 140. Moreover, the pre-program managing component 113 can determine a verify reference voltage associated with the logic state. The pre-program managing component 113 can further determine an amount of compensation for a shift in the threshold voltage of the memory cell after heat is applied (e.g., during a reflow process) to the memory device 130, 140, based at least on a thermal profile associated with the heat (e.g., a thermal profile used in the reflow process). The pre-program managing component 113 can further update the verify reference voltage using the amount of compensation. The pre-program managing component 113 can determine whether or not to continue applying a programming pulse to the memory cell based on the updated verify reference voltage. The programming pulse is applied to the memory cell before the heat is applied to the memory device 130, 140.

In some other implementations, the pre-program managing component 113 can determine a logic state to be stored at a memory cell of the memory device 130, 140. The logic state can be represented by a threshold voltage stored at the memory cell. The pre-program managing component 113 can also determine a verify reference voltage associated with the logic state. The verify reference voltage can define a target voltage level of the threshold voltage associated with the logic state. After determining the verify reference voltage, the pre-program managing component 113 can update the verify reference voltage using an amount of compensation for a shift in the threshold voltage of the memory cell expected to happen after heat is applied to the memory device 130, 140. Before the heat is applied to the memory device 130, 140, the pre-program managing component 113 can apply a plurality of sets of multiple programming pulses to the memory cell until a threshold condition is satisfied. The threshold condition can be associated with a relative magnitude of the threshold voltage of the memory cell to the updated verify reference voltage. Further details with regards to the operations of the pre-program managing component 113 are described below.

Figure 2:
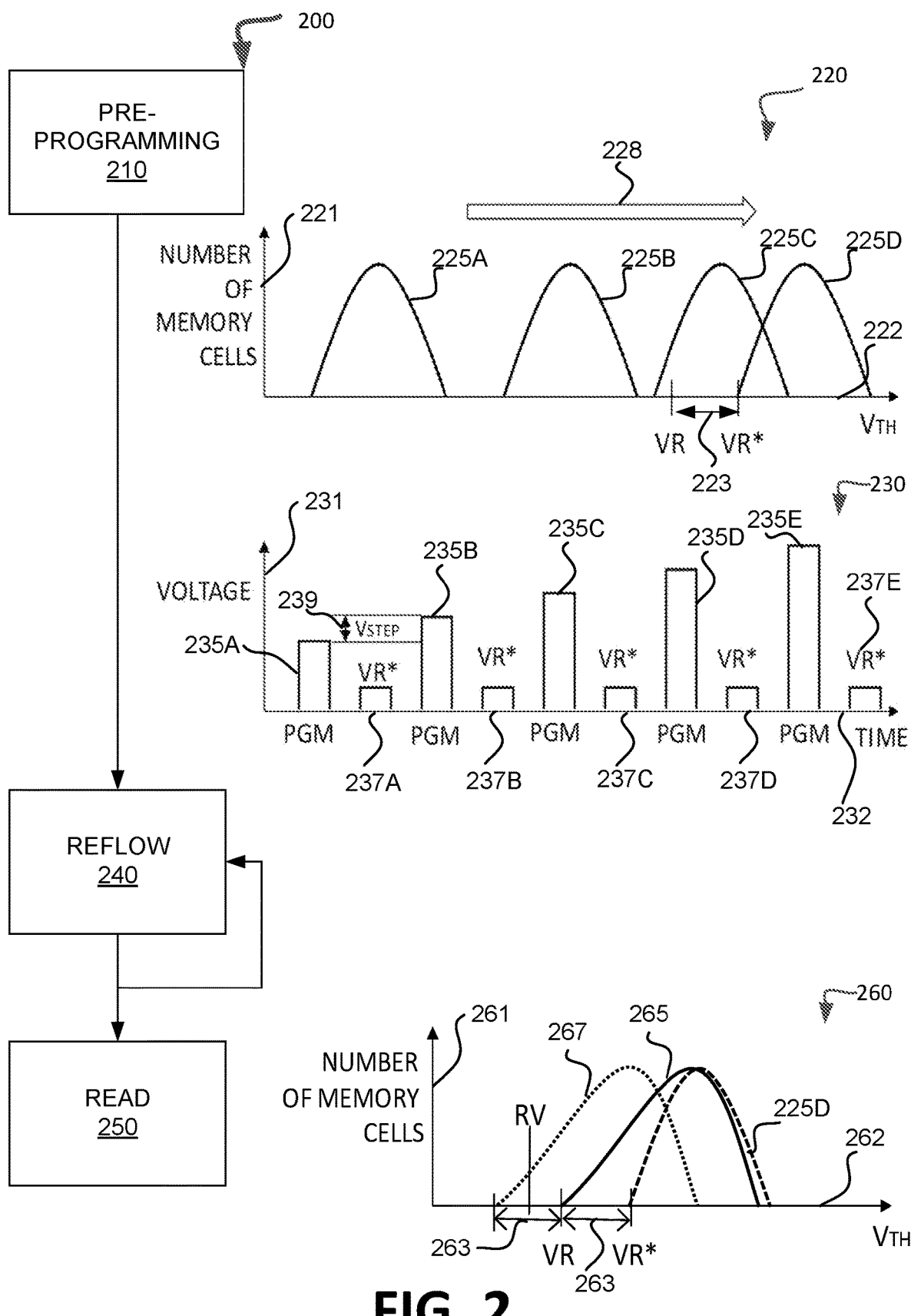
FIG. 2 is a block diagram of an example method to read pre-programmed data after a reflow process in accordance with some embodiments of the present disclosure.

FIG. 2 is a block diagram of an example method 200 to read pre-programmed data after a reflow process in accordance with some embodiments of the present disclosure. The method 200 can be performed by processing logic that can include hardware (e.g., a processing device, circuitry, dedicated logic, programmable logic, microcode, hardware of a device, integrated circuit, etc.), software (e.g., instructions run or executed on a processing device), or a combination thereof. In some embodiments, parts of the method 200 is performed by the pre-program managing component 113 of FIG. 1. Although the method may be described in a particular sequence or order, unless otherwise specified, the order of the processes can be modified. Thus, the embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 210, the processing device pre-programs a memory cell to store a logic state. A pre-programming operation corresponds to a programming operation performed at a factory, plant, or other facility before a memory device is soldered onto a printed circuit board and dispatched to customers. The pre-programming operation can be performed to thousands of memory devices in parallel. Nevertheless, the processing device can program memory cells of a memory device in a similar manner as other programming operations in that programming pulses are applied to a memory cell until a desired voltage is stored at the memory cell.

A graph 220 illustrates an example of threshold voltage distributions during a pre-programming of a logic state to memory cells in accordance with some embodiments of the present disclosure. As illustrated, the vertical axis 221 represents a number of memory cells and the horizontal axis 222 represents a threshold voltage.

On the threshold voltage axis 222, a verify reference voltage (VR) and an updated verify reference voltage (VR*) are marked. A verify reference voltage (sometimes, also called as a program-verify voltage) can define a target voltage level of the threshold voltage associated with the logic state. The processing device can instead use an updated verify reference voltage (VR*) in order to compensate for an expected shift in a threshold voltage after the memory device is exposed to the heat during the reflow operation 240. In one implementation, the processing device can determine an updated verify reference voltage (VR*) based on a thermal profile associated with the heat (e.g., a thermal profile used in the reflow process). The processing device can compute an expected amount of shift in threshold voltage (as indicated by the arrow 223) after the reflow operation 240 using an activation energy prediction model (e.g., the Arrhenius model). Then, the processing device can add the expected amount of threshold voltage shift (the arrow 223) to the verify reference voltage (VR) to update the verify reference voltage (VR*). Accordingly, the processing device can ensure that a threshold voltage of a memory cell stays within the target voltage level defined by the original verify reference voltage (VR) after the shift caused by the reflow process.

In another implementation, the processing device can determine the expected amount of shift (arrow 223) further based on the logic state being programmed. The processing device can determine a smaller expected amount of shift for a logic state 010, for example, when compared to a higher logic state 111, for instance. Yet in another implementation, the processing device can determine a larger expected amount of the shift for a memory device to be subjected to multiple reflow operations 240 than a memory device to be subjected to a single reflow operation 240.

As illustrated, after an initial programming pulse has been applied to memory cells to store a logic state, a threshold voltage distribution 225A can be formed by the memory cell. The threshold voltage distribution 225A represents an initial distribution of memory cells having a range of threshold voltages. As indicated by the distributions 225B to 225D, programming pulses can be continuously applied to the memory cells to push the distributions in the direction towards the update verify reference voltage (VR*), as indicated by an arrow 228. Once the processing device determines that a lower end of the distribution, e.g., the distribution 225D, is equal to and/or greater than the updated verify reference voltage (VR*), the processing device can determine to stop applying programming pulses to the memory cells. In other words, if all memory cells for storing the logic state has a threshold voltage equal to or greater than the updated verify reference voltage (VR*), the pre-programming operation 210 ends.

A graph 230 illustrates an example of programming pulses and verifying pulses for a pre-programming of a logic state to memory cells in accordance with some embodiments of the present disclosure. As illustrated, the vertical axis 231 represents a voltage level and the horizontal axis 232 represents time.

As mentioned above, the pre-programming operation involves two phases—a first phase for applying a programming pulse to applicable memory cells and a second phase for verifying whether threshold voltages have reached the target voltage level (i.e., the updated verify reference voltage (VR*)). For example, the processing device can apply a programming pulse (PGM 235A) at 15V to the memory cells. Subsequently, the processing device can apply the updated verify reference voltage (VR* 237A) to the memory cells and confirm whether threshold voltage of the memory cells are below or above the verify reference voltage 237A. In case it is determined that not all threshold voltages of memory cells are equal to or greater than the verify reference voltage (VR* 237A), then the processing device can determine a voltage level for the next programming pulse. In one implementation, the processing device can determine to increase the voltage level by an increment 239 (e.g., 0.4V). Sometimes, the incremental voltage 239 is referred to as a voltage step ($V_{STEP}$).

Accordingly, the processing device can apply the programming pulse 235B at the voltage level of 17V. Subsequently, the processing device can apply the updated verify reference voltage (VR* 237B) at the same voltage level as before to check if the threshold distribution of the memory cells has reached the updated verify reference voltage (VR* 437B). The processing device can perform the programming and verifying operations until all threshold voltages of the memory cells are equal to or greater than the updated verify reference voltage. In this way, the processing device can overcompensate the memory cells during the pre-programming operation 210 so that after the reflow process 240, the threshold distribution of memory cells would shift to the original verify reference voltage as if the shift had not occurred.

At operation 240, the memory device undergoes a reflow process. A reflow process involves soldering a memory device to a printed circuit board by applying a solder paste (e.g., lead-free solder paste) to both the memory device and the printed circuit board to permanently connect them together and baking the memory device and the printed circuit board at a high temperature (e.g., 230° C. to 255° C.). In the baking process, the heat can be gradually applied to the memory device with an increasing temperature and upon reaching a peak temperature, the heat can be reduced so that the memory device can be cooled down. The memory device can undergo the reflow process multiple times, such as three or more times.

At operation 250, the processing device can read data stored at the memory cell. As depicted, a graph 260 illustrates an example of a threshold voltage distribution of memory cells after undergoing the reflow process in accordance with some embodiments of the present disclosure. The vertical axis 261 represents a number of memory cells and the horizontal axis 262 represents a threshold voltage.

The distribution 265 represents the threshold voltage distribution of memory cells after the reflow process. Because the memory device (thus, memory cells) is heated at such a high temperature, the threshold voltages stored at the memory cells by the pre-programming operation 210 start shifting. In other words, charges stored at the memory cells become lost or redistributed thereby altering the threshold voltages. Accordingly, as illustrated, the original distribution 225D has been shifted by an amount of shift 263 after the memory cells have been exposed to the heat. Because the processing device can estimate the amount of the shift and pre-compensate that amount during pre-programming operation 210 (by updating the verify reference voltage (VR*), the resulting threshold distribution 265 has shifted to the voltage level of the original verify reference voltage (VR). As a result, when a read voltage (RV) is applied, the processing device can eliminate or reduce a read error as no memory cell has a threshold voltage shifted below the read voltage (RV).

The threshold distribution 267 represents what the distribution would be if the original verify reference voltage (VR) were to be used in the pre-programming operation 210. As illustrated, the distribution 267 would have shifted by the same or similar amount 263 as the distribution 265. However, there can be reading errors because some memory cells have threshold voltages below the read voltage (RV). It should also be noted that not all threshold voltages have been shifted by the same amount—accordingly, the distribution 265 is skewed to the right.

Figure 3:
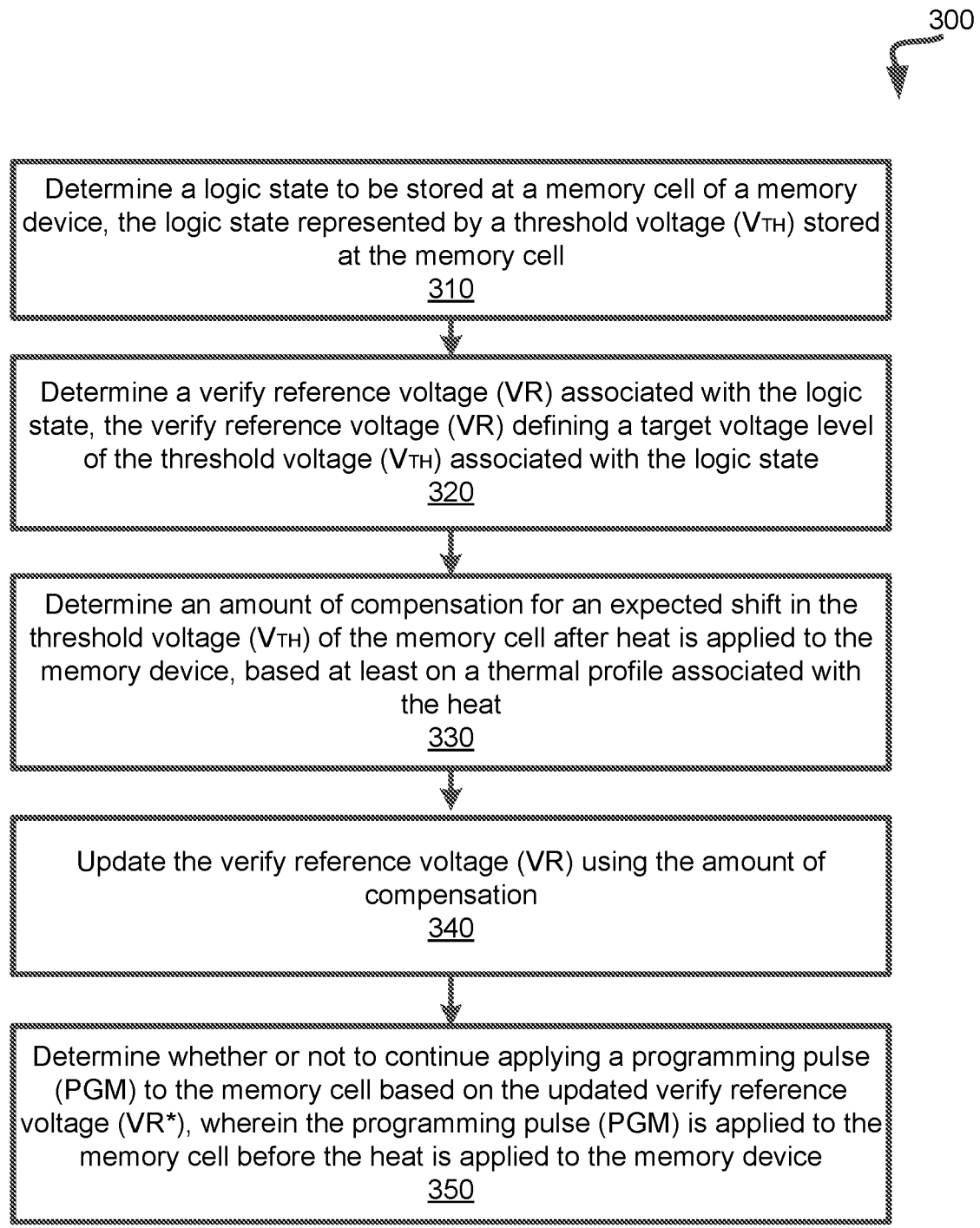
FIG. 3 is a flow diagram of an example method to apply a programming pulse to a memory cell in accordance with some embodiments of the present disclosure.

FIG. 3 is a flow diagram of an example method 300 to apply a programming pulse to a memory cell in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the pre-program managing component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 310, the processing device determines a logic state to be stored at a memory cell of a memory device. The processing device can receive data to store from a host system (e.g., the host system 120 of FIG. 1). Accordingly, the processing device can determine the logic state from the data. A logic state (i.e., bit information) can be represented by a threshold voltage ($V_{TH}$) stored at a memory cell. For example, a triple-level cell can store three bits of information and thus has eight logic states (e.g., 000, 001, 010, 011, 100, 101, 110, and 111). For simplicity, in this illustration, the higher the bit number, the higher the logic state is. For each logic state, memory cells should have a distinct threshold voltage ($V_{TH}$). Accordingly, the higher the logic state, the higher the threshold voltage ($V_{TH}$) of a memory cell is.

At operation 320, the processing device determines a verify reference voltage (VR) associated with the logic state. In some implementations, a verify reference voltage (VR) (sometimes, also called as a program-verify voltage) can define a target voltage level of the threshold voltage ($V_{TH}$) associated with the logic state. For each logic state, the processing device can assign a corresponding verify reference voltage (VR). In one implementation, the verify reference voltage (VR) of a logic state can correspond to a minimum voltage level that a threshold voltage ($V_{TH}$) should be in order for the respective memory cell to be determined as storing the logic state. The processing device can select a verify reference voltage (VR) corresponding to the logic state determined at operation 510 from a look-up table that lists verify reference voltages for each logic state.

At operation 330, the processing device determines an amount of compensation for a shift in the threshold voltage ($V_{TH}$) of the memory cell after heat is applied to the memory device, based at least on a thermal profile associated with the heat (e.g., thermal profile used in the reflow process). In some implementations, the amount of compensation corresponds to an approximation of the amount of shift to occur in the threshold voltage ($V_{TH}$) of the memory cell after the heat is applied to the memory device. The amount of compensation can correspond to a positive value (to compensate for a downward shift of the threshold voltage ($V_{TH}$)) or a negative value (to compensate for an upward shift of the threshold voltage ($V_{TH}$)).

The heat will be applied to the memory device after memory cells have been programmed (e.g., after operation 540). The heat will be applied as a part of a reflow process. A reflow process involves soldering the memory device to a printed circuit board by applying a solder paste (e.g., lead-free solder paste) to both the memory device and the printed circuit board to permanently connect them together and baking the memory device and the printed circuit board at a high temperature (e.g., 230° C. to 255° C.). The heat can be gradually applied to the memory device with an increasing temperature and upon reaching a peak temperature, the memory device will be cooled down. Because the memory device, thus memory cells, is heated at such a high temperature, threshold voltages stored at the memory cells start shifting. In other words, charges stored at the memory cells become lost or redistributed thereby altering the threshold voltages.

A thermal profile associated with the heat (e.g., thermal profile used in the reflow process) can include a temperature associated with the heat and a period of time the heat is applied to the memory device. In one implementation, the temperature associated with the heat corresponds to a peak temperature (e.g., 255° C.) and the period of time corresponds to a duration (e.g., 60 seconds) for the heat to reach the peak temperature while being applied to the memory device. The processing device can determine the amount of compensation using an activation energy prediction model (e.g., the Arrhenius model) based on the thermal profile.

In further implementations, the processing device can determine the amount of compensation based additionally on the logic state. Accordingly, the processing device can determine different amounts of compensation for different logic states. In one implementation, the processing device can determine a default amount of compensation computed using the model based on the thermal profile associated with the heat (e.g., thermal profile used in the reflow process). Then, the processing device can adjust the amount of compensation based on a logic state. For example, the processing device can adjust the default amount of compensation associated with a higher logic state (e.g., 111) to be at a higher voltage level than the amount of compensation associated with a lower logic state (e.g., 010). The processing device can adjust the default amount of compensation based on a linear or non-linear relationship.

In other further implementations, the processing device can determine the amount of compensation also based on a number of times the heat is to be applied to the memory device. The processing device can determine the number of times the heat is to be applied from a pre-configured table. In case the processing device determines that the heat is to be applied one time, the processing device may not adjust the default amount of compensation computed from the model. However, in case the processing device determines that the heat is to be applied multiple times, the processing device can adjust the default amount of compensation to a higher voltage level. The processing device can adjust the default amount of compensation based on a linear or non-linear relationship. In determining the amount of compensation based on different factors, the processing device can refer to a look-up table listing amounts of compensation for various scenarios to determine the appropriate amount of compensation.

At operation 340, the processing device updates the verify reference voltage (VR) using the amount of compensation. The processing device can combine the verify reference voltage (VR) with the amount of compensation. For example, the processing device can increase the verify reference voltage (VR) (e.g., 4V) by 2V as a result of approximating that the threshold voltage ($V_{TH}$) for the logic state will shift downward or become less by 2V.

At operation 350, the processing device can determine whether or not to continue applying a programming pulse (PGM) to the memory cell based on the updated verify reference voltage (VR*). The programming pulse (PGM) is applied to the memory cell to store the logic state or the threshold voltage ($V_{TH}$) to the memory cell. For example, the programming pulse is applied to the memory cell before the heat is applied to the memory device.

In order to determine whether or not to continue applying the programming pulse (PGM), the processing device can compare the current threshold voltage ($V_{TH}$) of the memory cell with the updated verify reference voltage (VR*). In one implementation, the processing device can determine that the current threshold voltage ($V_{TH}$) of the memory cell has not reached the updated verify reference voltage (VR*) when the current threshold voltage ($V_{TH}$) is less than the updated verify reference voltage (VR*). In such a case, the processing device can determine to continue applying the programming pulse (PGM) to the memory cell. Accordingly, the processing device can apply the programming pulse (PGM) (at a higher voltage level) to the memory cell.

On the other hand, the processing device can determine that the threshold voltage ($V_{TH}$) of the memory cell has been reached when the current threshold voltage ($V_{TH}$) is equal to or greater than the updated verify reference voltage (VR*).

In response to determining as such, the processing device can determine not to continue applying the programming pulse (PGM) to the memory cell. Accordingly, the processing device can pre-compensate the prospective shift in the threshold voltage ($V_{TH}$) in advance before the shift occurs. In this way, even after the threshold voltage ($V_{TH}$) shifts as a result of the reflow process, the threshold voltage ($V_{TH}$) would be within the target voltage level set by the original verify reference voltage (VR). As such, by adjusting the target voltage by an estimated amount of the shift, the threshold voltage ($V_{TH}$) would remain within the target range defined by the original verify reference voltage (VR) even after the shift. Therefore, the error rate in reading a logic state can be reduced.

Figure 4:
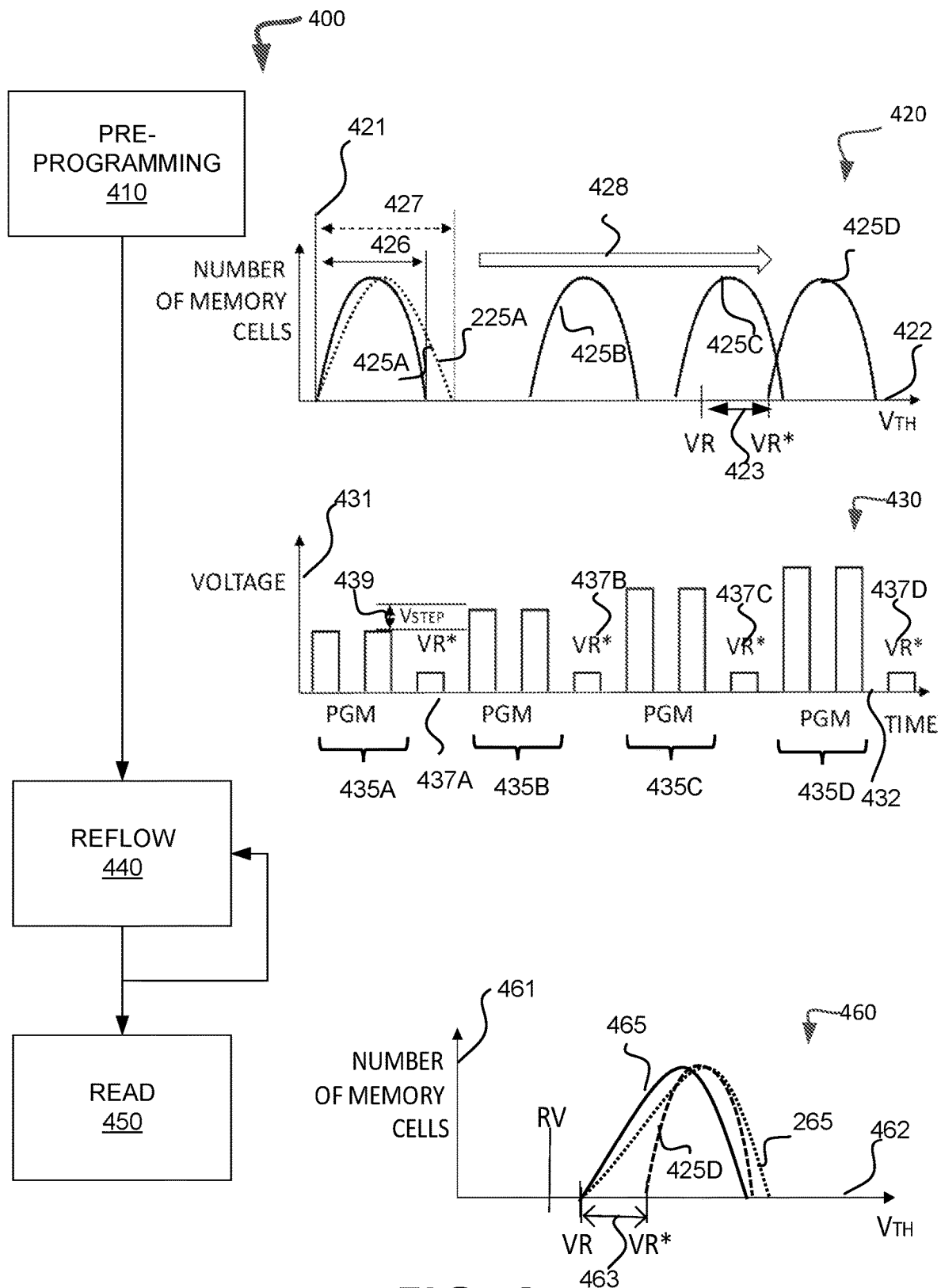
FIG. 4 is a block diagram of an example method to read pre-programmed data after a reflow process in accordance with some other embodiments of the present disclosure.

FIG. 4 is a block diagram of an example method 400 to read pre-programmed data after a reflow process in accordance with some other embodiments of the present disclosure. The method can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, parts of the method is performed by the pre-program managing component 113 of FIG. 1. Although the method may be described in a particular sequence or order, unless otherwise specified, the order of the processes can be modified. Thus, the embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 410, the processing device pre-programs a memory cell to store a logic state, similar to operation 210. A graph 420 illustrates an example of threshold voltage distributions during a pre-programming of a logic state to memory cells in accordance with some embodiments of the present disclosure. As illustrated, the vertical axis 421 represents a number of memory cells and the horizontal axis 422 represents a threshold voltage.

As marked on the threshold voltage axis 422, the processing device can determine a corresponding verify reference voltage (VR) for the logic state to be stored at the memory cells. Then, the processing device can update the verify reference voltage (VR*) by adding an amount 423 to compensate for a shift in a threshold voltage expected to happen after the memory device is exposed to the heat during the reflow operation 440. As described above with respect to the amount of shift (arrow 223), the processing device can similarly compute the amount 423 by using an activation energy prediction model and factoring in a thermal profile associated with the heat (e.g., thermal profile used in the reflow process) to be used in operation 440 and any other factors.

The processing device can apply a set of multiple programming pulses at the same voltage level to the memory cells designated to store the logic state. The threshold voltage distribution 425A represents the distribution of threshold voltages of the memory cells after the initial application of the multiple programming pulses. As illustrated, when the distribution 425A is compared with the distribution 225A (the threshold voltage distribution when only one programming pulse has been applied to the memory cells) of FIG. 2, it can be observed that the distribution 425A is tighter than the distribution 225A. That is, the distribution 425A has a narrower range 426 of threshold voltages than that 427 of the distribution 225A. By applying multiple programming pulses one after another, charge losses at the memory cells are better retained or suppressed.

The rest of the pre-programming operation 410 is similar to the operation 210 described above. For example, the multiple programming pulses are applied to the memory cells to push the threshold voltage distributions 425B-425C to a direction 428 until the updated verify reference voltage (VR*) is reached by the lower end of the distribution 425D.

A graph 430 illustrates an example of programming pulses and verifying pulses a pre-programming of a logic state to memory cells in accordance with some embodiments of the present disclosure. As illustrated, the vertical axis 431 represents a voltage level and the horizontal axis 432 represents time. Similar to the graph 230, a series of programming pulses and verifying pulses are applied to the memory cells over time until threshold distributions of the memory cells satisfy the minimum voltage requirement set by the updated verify reference voltage (VR*).

For example, the processing device can initially apply two programming pulses (435A) at 15V. When applying the two programming pulses, the processing device can apply the programming pulses consecutively. In one implementation, the processing device can apply the second programming pulse as soon as an electrical field used to apply the first programming pulse is removed. Although the graph 430 illustrates application of two programming pulses, the processing device can apply a different number of programming pulses throughout the pre-programming operation 410.

In one implementation, the processing device can set the number of programming pulses to a fixed number (e.g., two). However, in another implementation, the processing device can determine the number of programming pulses based on a number of times a reflow operation 440 is performed to the memory device. If the memory device is to undergo multiple reflow operations 440, the processing device can determine to use a higher number (e.g., three) of programming pulses. Yet in another implementation, the processing device can determine the number of programming pulses based on the logic state being programmed to the memory cells. For a higher logic state (e.g., a logic state 111), the processing device can use a higher number (e.g., three) of programming pulses as opposed to using a less number (e.g., two) of programming pulses for a lower logic state (e.g., a logic state 010).

Subsequently, the processing device can apply the updated verify reference voltage (VR* 437A) to the memory cells and confirm whether threshold voltage of the memory cells are below or above the verify reference voltage 437A. For example, in response to determine that the threshold voltages are below the verify reference voltage 437A, the processing device can apply the next set of multiple programming pulses 435B. The processing device can determine a voltage level for the programming pulses 435B by adding an incremental voltage (or a voltage step ($V_{STEP}$)) 439 (e.g., 0.4V) to the voltage level of the previous set of programming pulses 435A. In one implementation, the processing device can apply the same incremental voltage ($V_{STEP}$) 439 for the rest of the sets of programming pulses 435B-435D. In another implementation, the processing device can vary the incremental voltage ($V_{STEP}$) 439 for later sets of programming pulses, for example 435C-435D. For example, the processing device can reduce the incremental voltage ($V_{STEP}$) 439 for the programming pulses 435C-435D. Yet, in another implementation, the processing device can use a smaller incremental voltage ($V_{STEP}$) 439 for a memory device that will be undergoing a more number of reflow operations 440.

Subsequently, the processing device can apply the updated verify reference voltage (VR* 437B) at the same voltage level as before to check if threshold distribution of the memory cells has reached the updated verify reference voltage. The processing device can perform the programming and verifying operations until all threshold voltages of the memory cells are equal to or greater than the updated verify reference voltage.

At operation 440, the memory device undergoes a reflow process similar to the reflow process of operation 240. Accordingly, the memory device can be subject to a high temperature (e.g., 255° C.) heat for a period of time (e.g., 60 seconds).

At operation 450, the processing device can read data stored at the memory cell. As depicted, a graph 460 illustrates an example of a threshold voltage distribution of memory cells after undergoing the reflow process in accordance with some embodiments of the present disclosure. The vertical axis 461 represents a number of memory cells and the horizontal axis 462 represents a threshold voltage.

The distribution 465 represents the threshold voltage distribution of memory cells after the reflow process. Because of the heat applied during the reflow operation 440, charges stored at the memory cells become lost or redistributed thereby causing the threshold voltages to shift as illustrated by the threshold voltage distribution 465—when compared to the threshold voltage distribution 425D of the memory cells before the reflow operation 440. However, because the processing device can estimate the amount of the shift and pre-compensate that amount during pre-programming operation 410 (by updating the verify reference voltage (VR*), the resulting threshold distribution 465 has shifted to the voltage level of the original verify reference voltage (VR). As a result, when a read voltage (RV) is applied, the processing device can eliminate or reduce a read error because no memory cell has a threshold voltage shifted below the read voltage (RV).

The threshold distribution 265 represents the after-reflow threshold voltage distribution of memory cells pre-programmed using a single programming pulse, but with the same range of voltage levels. As illustrated, the distribution 465 has a tighter distribution of threshold voltages than the distribution 265. Moreover, the distribution 465 is less skewed to the right than the distribution 265. As such, application of multiple programming pulses can suppress charge losses even after the reflow operation 440.

Figure 5:
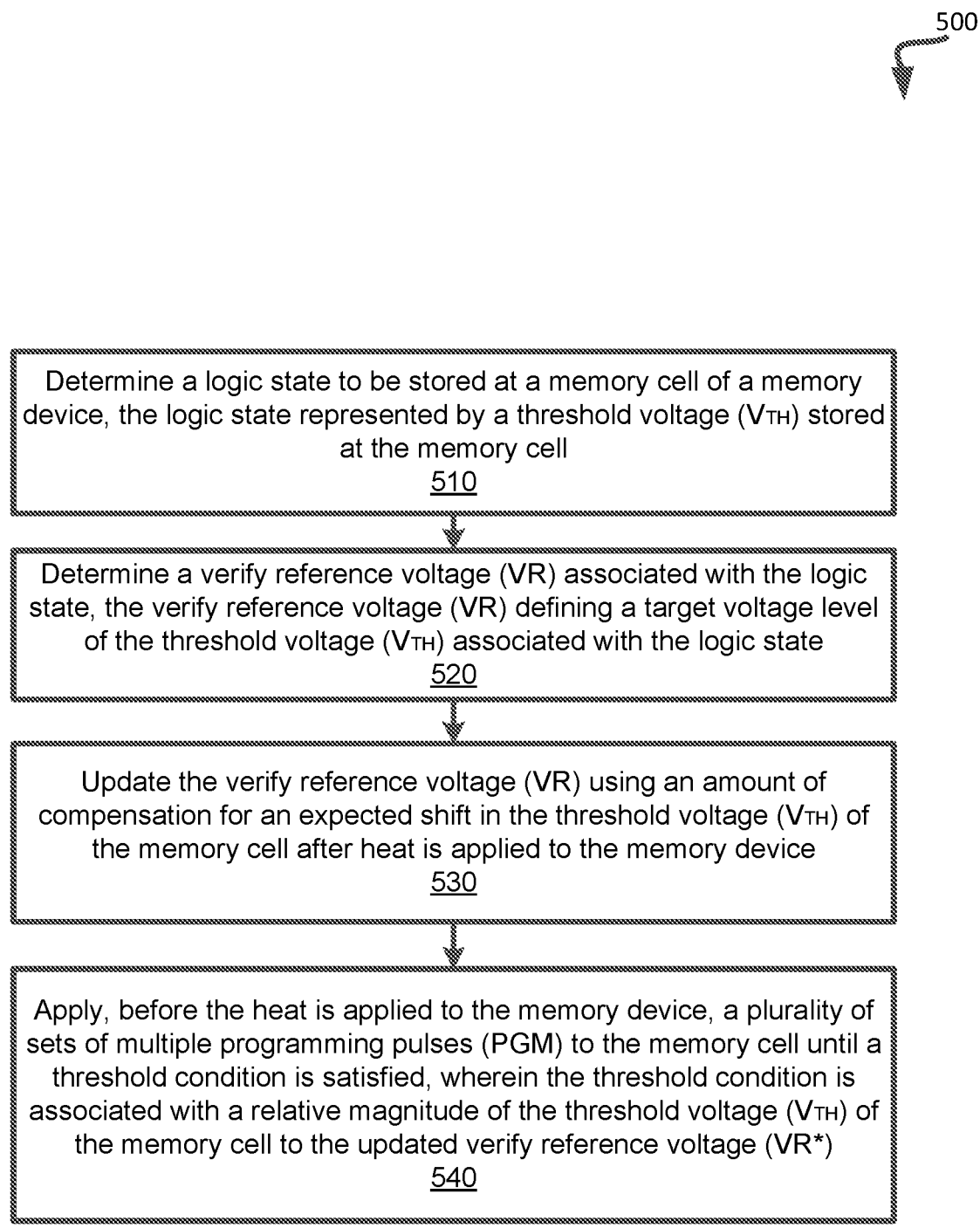
FIG. 5 is a flow diagram of an example method to determine whether to continue applying a programming pulse to a memory cell in accordance with some embodiments of the present disclosure.

FIG. 5 is a flow diagram of an example method 500 to determine whether to continue applying a programming pulse (PGM) to a memory cell in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the pre-program managing component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 510, the processing device determines a logic state to be stored at a memory cell of a memory device, similar to operation 310. A logic state (i.e., bit information) can be represented by a threshold voltage ($V_{TH}$) stored at a memory cell. For example, a triple-level cell can store three bits of information and thus has eight logic states (e.g., 000, 001, 010, 011, 100, 101, 110, and 111, in ascending order).

At operation 520, the processing device determines a verify reference voltage (VR) associated with the logic state in a similar manner as described with respect to operation 320. A verify reference voltage (VR) (sometimes, also called as a program-verify voltage) can define a target voltage level of the threshold voltage ($V_{TH}$) associated with the logic state. In one implementation, the verify reference voltage (VR) can correspond to a lower limit of the threshold voltage ($V_{TH}$). In another implementation, the verify reference voltage (VR) can set an upper limit for the threshold voltage ($V_{TH}$). The processing device can determine a different verify reference voltage (VR) for a different logic state.

At operation 530, the processing device updates the verify reference voltage (VR) using an amount of compensation for an expected shift in the threshold voltage ($V_{TH}$) of the memory cell after heat is applied to the memory device. In some implementations, the amount of compensation corresponds to an approximation of the amount of shift to occur in the threshold voltage ($V_{TH}$) of the memory cell after the heat is applied to the memory device. The amount of compensation can correspond to a positive value (to compensate for a downward shift of the threshold voltage ($V_{TH}$)) or a negative value (to compensate for an upward shift of the threshold voltage ($V_{TH}$)).

In one implementation, the processing device can determine the amount of compensation based on the logic state and a thermal profile associated with the heat (e.g., thermal profile used in the reflow process). The heat will be applied to the memory device as a part of the reflow process to solder the memory device to a printed circuit board as describe above with respect to operation 330. The thermal profile, for example, can include a temperature associated with the heat and a period of time the heat is to be applied to the memory device. For example, the processing device can compute the amount of compensation based on an activation energy prediction model (e.g., the Arrhenius model) by factoring in the logic state and the thermal profile associated with the heat (e.g., thermal profile used in the reflow process) as described above with respect to operation 330. Accordingly, the processing device can estimate how much the threshold voltage ($V_{TH}$) would shift after the reflow process based on the logic state and the thermal profile associated with the heat (e.g., thermal profile used in the reflow process).

In one implementation, the processing device can determine different amounts of compensation for different logic states. For example, the processing device can determine the amount of compensation associated with a lower logic state (e.g., 010) to be smaller than the amount of compensation associated with a higher logic state (e.g., 111). Moreover, the higher the temperature of the heat is or the longer the heat is to be applied to the memory device, the processing device can determine the amount of compensation to be greater. More details about determining the amount of compensation are described above with respect to FIG. 3. In another implementation, the processing device can incorporate other factors such as a number of times the heat is to be applied to the memory device in determining the amount of compensation as will described above with respect to FIG. 3.

Once the amount of compensation is determined, the processing device can update the verify reference voltage (VR) by combining the verify reference voltage (VR) with the amount of compensation.

At operation 540, before the heat is applied to the memory device, the processing device applies a plurality of sets of multiple programming pulses (PGMs) to the memory cell until a threshold condition is satisfied. For example, the processing device can apply or send instructions to apply a set of multiple programming pulses (PGMs) to the memory cell to determine (or store) the threshold voltage ($V_{TH}$) to the memory cell. In some implementations, the processing device can apply the programming pulses (PGMs) over multiple cycles or in steps. For each step, the processing device can apply a set of multiple programming pulses (PGMs). In one implementation, the processing device can apply multiple programming pulses (PGMs) at the same voltage level. In a further implementation, the processing device can consecutively apply each programming pulses (PGMs) to the memory cell. In other words, the processing device can apply the next programming pulse of the same set when an electrical field used to apply the previous programming pulse of the same set is removed. Then, for the next set of multiple programming pulses (PGMs), the processing device can apply the programming pulses (PGMs) at an incrementally increased voltage level.

In a further implementation, the processing device can determine a number of programming pulses (PGMs) that includes a set based on the logic state. Instead of applying the same number (e.g., two) of programming pulses (PGMs), the processing device can vary the number of programming pulses (PGMs) depending on the logic state being stored at the memory cell. For example, for a higher logic state (e.g., logic states greater than 010), the processing device can determine to apply three programming pulses (PGMs). As another example, the processing device can determine to gradually increase the number of programming pulses (PGMs) for higher logic states, such as applying three programming pulses (PGMs) for logic states 010 to 100 and four programming pulses (PGMs) for logic states 101 to 111.

The processing device can determine whether the threshold condition is satisfied by comparing the updated verify reference voltage (VR*) with a current threshold voltage ($V_{TH}$) of the memory cell. In some implementations, the threshold condition can be associated with a relative magnitude of the threshold voltage ($V_{TH}$) of the memory cell to the updated verify reference voltage (VR*). In one implementation, the processing device can determine that the threshold condition is satisfied when the threshold voltage ($V_{TH}$) of the memory cell is equal to or greater than the updated verify reference voltage (VR*). In another implementation, the processing device can determine the threshold condition is satisfied when the threshold voltage ($V_{TH}$) of the memory cell is equal to or less than the updated verify reference voltage (VR*). The processing device can use different threshold conditions for different logic states. For example, the processing device can determine that the updated verify reference voltage (VR*) as an upper limit for the threshold voltage ($V_{TH}$) corresponding to the logic state 000. As another example, the processing device can determine that the updated verify reference voltage (VR*) as a lower limit for the threshold voltage ($V_{TH}$) corresponding to the logic state 111. In response to determining that the threshold condition is satisfied, the processing device can stop or send instructions to stop applying programming pulses (PGMs) to the memory cell.

On the other hand, in response to determining that the threshold condition is not satisfied, the processing device can apply the next set of multiple programming pulses (PGMs) to the memory cell. The processing device can use a higher voltage level for the programming pulses (PGMs) of this set than that of the previous set. The difference between the two voltage levels are sometimes referred to as a voltage step. In one implementation, the processing device can determine a difference in the voltage level used for two consecutive sets of programming pulses (PGMs) based on a number of times a set of multiple programming pulses (PGMs) has been applied to the memory cell and/or a number of times the heat is to be applied to the memory device. For example, as the number of sets of programming pulses (PGMs) that has already been applied increases, the processing device can reduce the voltage step for the subsequent sets. As another example, when the number of times the heat is to be applied to the memory device is three (as opposed to one), the processing device can reduce the voltage step for all or a portion of sets of multiple programming pulses (PGMs).

Figure 6:
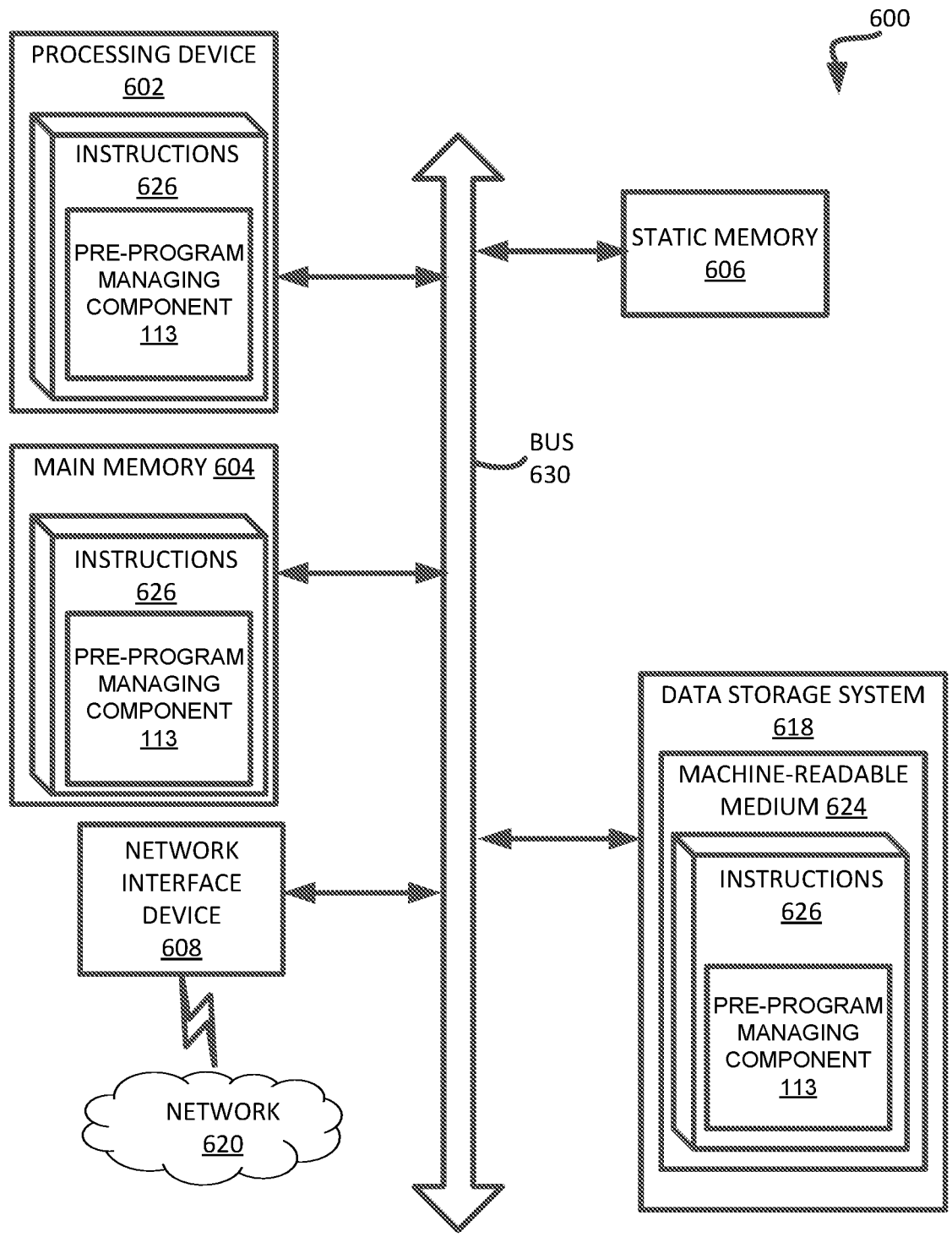
FIG. 6 is a block diagram of an example computer system in which embodiments of the present disclosure may operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the pre-program managing component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or RDRAM, etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a read and write voltage managing component (e.g., the pre-program managing component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
   a memory device; and
   a processing device, operatively coupled with the memory device, the processing device configured to perform operations comprising:
      determining a verify reference voltage associated with a logic state of a memory cell of the memory device, the verify reference voltage defining a target voltage level of a threshold voltage associated with the logic state;
      determining an amount of voltage compensation based on a thermal profile associated with a heat to be applied to the memory device, the thermal profile comprising a temperature associated with the heat and a period of time the heat is to be applied to the memory device; and
      updating the verify reference voltage using the amount of voltage compensation for an expected shift in the threshold voltage of the memory cell after the heat is applied to the memory device.

2. The system of claim 1, wherein updating the verify reference voltage comprises combining the verify reference voltage with the amount of voltage compensation.

3. The system of claim 2, wherein the amount of voltage compensation associated with a lower logic state is less than the amount of voltage compensation associated with a higher logic state.

4. The system of claim 1, wherein the operations further comprise, applying, before the heat is applied to the memory device, a plurality of sets of multiple programming pulses to the memory cell until a threshold condition is satisfied, wherein the threshold condition is associated with a relative magnitude of the threshold voltage of the memory cell to the updated verify reference voltage.

5. The system of claim 4, wherein applying the plurality of sets of multiple programming pulses comprises:
   applying a first set of multiple programming pulses to the memory cell to determine the threshold voltage to the memory cell;
   determining whether the threshold condition is satisfied by comparing the updated verify reference voltage with a current threshold voltage of the memory cell;
   in response to determining that the threshold condition is not satisfied, applying a second set of multiple programming pulses to the memory cell, the second set of multiple programming pulses being applied at a higher voltage level than the first set of multiple programming pulses; and
   in response to determining that the threshold condition is satisfied, stopping the applying of the plurality of sets of multiple programming pulses to the memory cell.

6. The system of claim 4, wherein applying the plurality of sets of multiple programming pulses comprises applying a set of multiple programming pulses at a same voltage level, each one of the multiple programming pulses being applied to the memory cell, consecutively.

7. The system of claim 4, wherein applying the plurality of sets of multiple programming pulses comprises determining a number of programming pulses that comprises a set based on the logic state.

8. The system of claim 4, wherein applying the plurality of sets of multiple programming pulses comprises determining a difference in a voltage level used for two consecutive sets of multiple programming pulses based on at least one of a number of times a set of multiple programming pulses has been applied to the memory cell, or a number of times the heat is to be applied to the memory device.

9. A method comprising:
   determining a verify reference voltage associated with a logic state of a memory cell of a memory device, the verify reference voltage defining a target voltage level of a threshold voltage associated with the logic state;
   determining an amount of voltage compensation based on a thermal profile associated with a heat to be applied to the memory device, the thermal profile comprising a temperature associated with the heat and a period of time the heat is to be applied to the memory device; and
   updating the verify reference voltage using the amount of voltage compensation for an expected shift in the threshold voltage of the memory cell after the heat is applied to the memory device.

10. The method of claim 9, wherein updating of the verify reference voltage further comprises combining the verify reference voltage with the amount of voltage compensation.

11. The method of claim 10, wherein the amount of voltage compensation associated with a lower logic state is less than the amount of voltage compensation associated with a higher logic state.

12. The method of claim 9, further comprising applying, before the heat is applied to the memory device, one or more programming pulses to the memory cell until a threshold condition is satisfied, wherein the threshold condition is associated with a relative magnitude of the threshold voltage of the memory cell to the updated verify reference voltage.

13. The method of claim 12, wherein applying the one or more programming pulses comprises:
applying a first set of multiple programming pulses to the memory cell to determine the threshold voltage to the memory cell;
determining whether the threshold condition is satisfied by comparing the updated verify reference voltage with a current threshold voltage of the memory cell; and
in response to determining that the threshold condition is not satisfied, applying a second set of multiple programming pulses to the memory cell, the second set of multiple programming pulses being applied at a higher voltage level than the first set of multiple programming pulses.

14. The method of claim 12, wherein applying the one or more programming pulses comprises applying a set of multiple programming pulses at a same voltage level, each one of the multiple programming pulses being applied to the memory cell consecutively.

15. The method of claim 12, wherein applying the one or more programming pulses comprises determining a number of programming pulses in a set based on the logic state.

16. The method of claim 12, wherein applying the one or more programming pulses comprises determining a difference in a voltage level used for two consecutive sets of multiple programming pulses based on at least one of a number of times a set of multiple programming pulses has been applied to the memory cell, or a number of times the heat is to be applied to the memory device.

17. An apparatus comprising:
a plurality of memory cells; and
a processing device configured to perform operations comprising:
determining a verify reference voltage associated with a logic state of a memory cell of the plurality of memory cells, the verify reference voltage defining a target voltage level of a threshold voltage associated with the logic state;
determining an amount of voltage compensation based on a thermal profile associated with a heat to be applied to the plurality of memory cells, the thermal profile comprising a temperature associated with the heat and a period of time the heat is to be applied to the plurality of memory cells; and
updating the verify reference voltage using the amount of voltage compensation for an expected shift in the threshold voltage of the memory cell after the heat is applied to the plurality of memory cells.

18. The apparatus of claim 17, wherein updating the verify reference voltage comprises combining the verify reference voltage with the amount of voltage compensation.

19. The apparatus of claim 18, wherein the amount of voltage compensation associated with a lower logic state is less than the amount of voltage compensation associated with a higher logic state.

20. The apparatus of claim 17, wherein the operations further comprise, applying, before the heat is applied to the plurality of memory cells, a plurality of sets of multiple programming pulses to the memory cell until a threshold condition is satisfied, wherein the threshold condition is associated with a relative magnitude of the threshold voltage of the memory cell to the updated verify reference voltage.

* * * * *